United States Patent [19]
Chu

[11] Patent Number: 5,747,389
[45] Date of Patent: May 5, 1998

[54] CRACK RESISTANT PASSIVATION LAYER

[75] Inventor: John K. Chu, Fremont, Calif.

[73] Assignee: Intel Corporation, Santa Clara, Calif.

[21] Appl. No.: 890,287

[22] Filed: May 26, 1992

Related U.S. Application Data

[63] Continuation of Ser. No. 693,694, Apr. 30, 1991, abandoned.

[51] Int. Cl.$^6$ .................................................. H01L 21/469
[52] U.S. Cl. .......................... 438/783; 438/784; 438/778; 438/958
[58] Field of Search .................................. 437/225, 235, 437/236, 238, 240; 438/778, 783, 784, 787, 958

[56] References Cited

U.S. PATENT DOCUMENTS

| | | | |
|---|---|---|---|
| 4,349,584 | 9/1982 | Flatley et al. | 437/947 |
| 4,574,467 | 3/1986 | Halfacre et al. | 437/70 |

OTHER PUBLICATIONS

Becker et. al., "Process and Film . . . borophosphosilicate glass"; J. Vac. Sci. Technol. B 4(3); May/Jun. 1986; pp. 732–744.

Wolf; "Silicon Processing for the VLSI era"; vol. 1; 1986; pp. 187–191.

"MMT's Chemical Vapor Deposition Equiqment Guide"; Microelectric Manufacturing and Testing; May 1988; pp. 44–45.

"Doped SiO$_2$ deposition from TMP in ApCVD"; Bartholomew et. al.; European Transactions on Telecommunications and Related Technologies, vol. 2, No. 4, Mar./Apr. 1990, pp. 167–172.

"Optimization of APCVD TEOS/O$_3$ process for SiO$_2$ and BPSG"; Bartholomew et al.; Third Annual Dielectrics and CVD Metallization Symposium, Feb. 11–12, 1991; pp. 110–145.

Wolf, "Silicon processing for the VLSI Era", vol. 1: Process Technology, Lattice Press, 1986, pp. 182–186.

Primary Examiner—Trung Dang
Attorney, Agent, or Firm—Blakely, Sokoloff, Taylor & Zafman

[57] ABSTRACT

A method for making a device and the device itself which utilizes a passivation layer displaying improved crack resistance is disclosed. This is accomplished through the incorporation of boron into a PSG passivation layer. The temperature of the passivation deposition may need to be kept to a temperature low enough so that the boron compound used for the boron source does not decompose prior to reacting with other reactants.

13 Claims, 2 Drawing Sheets

CRACK RESISTANT PASSIVATION LAYER

This is a continuation of application Ser. No. 07/693,694, filed Apr. 30, 1991.

FIELD OF THE INVENTION

The present invention relates generally to the field of processing of semiconductor devices, and particularly, to the formation of passivation layers.

BACKGROUND OF THE INVENTION

Semiconductor components are made by various process steps on a semiconductor substrate. Electrical circuits are defined during the early portions of the process sequence. The uppermost layer of a device is called the passivation layer. The passivation layer must prevent the underlying circuits from being scratched and prevent contaminants from reaching the underlying layers. A passivation layer must be crack free to prevent the contaminants from reaching the underlying layers. The cracking of passivation layers rarely happens during deposition but is more likely to occur during post-deposition processing. Temperature cycling of the passivation layer during post-deposition processing steps makes the passivation layer more susceptible to cracking, and therefore, these subsequent steps are notorious for causing cracks in the passivation layer. Alloy, assembly, and packaging steps can reach temperatures as high as 450° C. which could cause cracks to form with many passivation layers.

A plethora of materials are used for passivation of which silicon dioxide is one. Typically, the silicon dioxide is deposited on the wafer by chemical vapor deposition (CVD) performed at atmospheric pressure (APCVD) or lower (LPCVD). Compared to undoped CVD oxide, phosphorus is used to getter mobile ions, to produce a film which has a higher wet chemical etch rate, to produce a film with greater reflow ability, or to make a film that is more crack resistant. Passivation layers which are made of CVD oxide almost always include phosphorus. CVD oxide with phosphorus is called phosphosilicate glass (PSG). PSG is used primarily for gettering mobile ions such as $Na^+$ and to make a crack free passivation layer. Increasing the phosphorus content increases the crack resistance of a PSG film.

Passivation layers have been manufactured on many different types of machines. By incorporating only phosphorus into the CVD oxide, most systems have produced a substantially crack free passivation layer with the desired properties (protecting the underlying devices from scratches and contaminants). One such system that has made an acceptable PSG passivation layer is the AMS 2100. However, more production worthy machines are required, such as the Watkins-Johnson 999 (WJ-999) system. To Applicant's knowledge, the WJ-999 system has not been capable of forming a passivation layer with the same crack resistance while maintaining the same phosphorus content. As of this date, Applicant does not understand why this phenomenon is seen. Prior art solutions to the cracking problem associated with the WJ-999 system have included a higher deposition temperature and a higher phosphorus content of the passivation layer, as is discussed in more detail immediately below.

The higher deposition temperature could form a passivation layer which is denser, and therefore, may be more resistant to cracking. The temperature selected should be higher than the highest temperature of the subsequent processing steps, such as alloy, assembly, and packaging. Since the film is deposited at a higher temperature, the film should be able to withstand temperature cycling during subsequent processing steps that are performed lower than the deposition temperature. There have been numerous problems associated with the use of a higher deposition temperature, one of which has been junction spiking. The metal may form spikes into the substrate, or vice versa. In a related problem, barrier layer consumption increases with higher temperatures resulting in two materials contacting one another that are not supposed to be touching. Device characteristics are sensitive to post-metalization temperature cycles. The threshold voltages of the devices could significantly change with a higher passivation deposition temperature.

Increasing the phosphorus content could make a passivation layer more crack resistant. The phosphorus content was taken as a high as 6.5 weight %, but the passivation layer still formed cracks on a WJ-999 system. Tests higher than 6.5 weight % phosphorus were not attempted since there is an increased risk that the phosphorus in the passivation layer could react with moisture in the atmosphere and form phosphoric acid within the device. Phosphoric acid could corrode the underlying metal layers, possibly resulting in the creation of open circuits. Another problem with a high phosphorus content has been that it reduces photoresist adherence to the passivation layer which seriously compromises photoresist patterning on the layer.

SUMMARY OF THE INVENTION

In view of the foregoing, it is the principal object of the present invention to produce a passivation layer with improved crack resistance throughout the entire processing sequence of a semiconductor device.

It is an additional object of the present invention to form a passivation layer that is more resistant to cracking while maintaining an uncomplicated and reliable manufacturing process.

It is a further object of the present invention to produce a crack resistant passivation film on the WJ-999 system.

As will be described in more detail hereinafter, the present invention resides in the incorporation of boron into the PSG passivation layer in amounts sufficient to improve its crack resistance, and, in any event, to ensure a process for a WJ-999 machine. While it is true that boron is a known dopant of lower CVD oxide layers such as an interlevel dielectric, it has been used for modifying the wet chemical etch rate or to improve the reflow properties of a CVD oxide. Up until now, to Applicant's knowledge there was no reason to believe that boron would be a successful candidate in improving the crack resistance of the passivation layer. Indeed, no one has even considered heretofore, to Applicant's knowledge, the use of boron for the purposes of improving the crack resistance in any layer, or the use of boron in a passivation layer. By adjusting the boron concentration in the film, Applicant has discovered a more crack-resistant film is obtained without creating other process problems and without increasing the phosphorus concentration or raising the deposition temperature.

DETAILED DESCRIPTION OF THE PRESENT INVENTION

A method for substantially increasing the crack resistance of a passivation layer while preventing processing complications inherent with running a process with high deposition temperatures or with high phosphorus dopant concentrations is disclosed. In the following description, numerous details are set forth, such as specific materials, process parameters, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

The invention disclosed describes the procedure for forming a substantially crackfree passivation layer for a metal-oxide-semiconductor (MOS) device. This procedure is equally suited for any device where a passivation layer is used. The substrate is subjected to many different process steps which define the electrical components that make up the integrated circuits. The process involves field isolation, gate definition, source/drain formation, interlevel dielectrics, contact definition, metalization, and passivation. The actual steps up to passivation are well known in the art, and in any event are not critical to the invention. Hence, these steps are not discussed herein.

Figure 1:
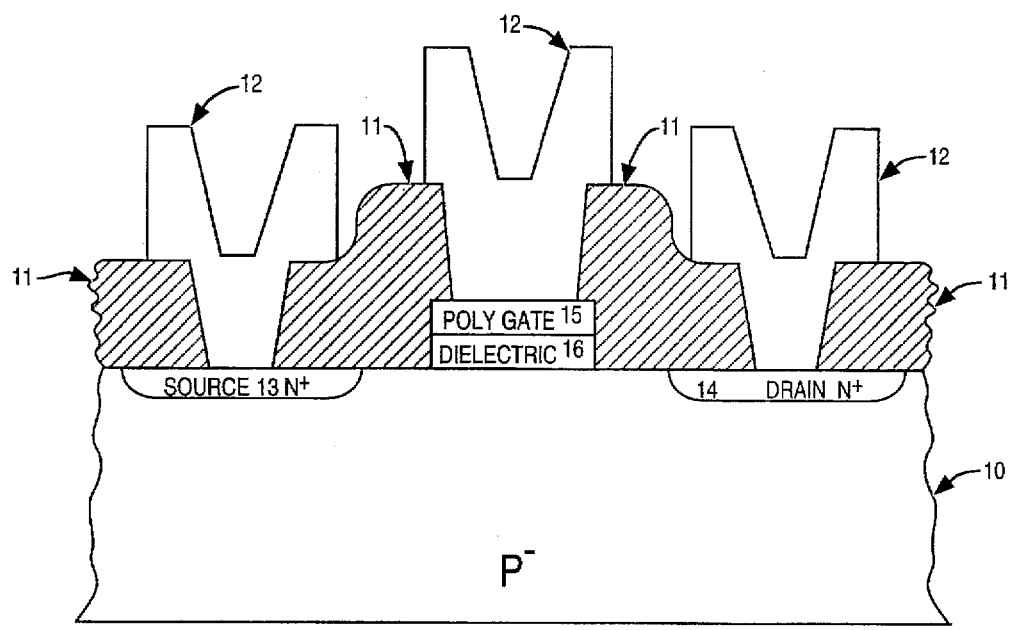
FIG. 1 is a cross sectional view of a substrate after a metal pattern has been defined and etched.

FIG. 1 shows a cross sectional view of a substrate prior to the passivation layer deposition. For simplicity, the field isolations regions are not shown. Region 10 is the substrate which is lightly doped P-type crystalline silicon with a resistivity of about 50 ohm-cm. The actual resistance is not critical to the invention. Region 11 is the lower interlevel dielectric. Regions 12 are metal contacts following metal etch. The MOS of FIG. 1 device has the following: a source (region 13), a drain (region 14), a polysilicon gate (region 15), and a dielectric between gate and the substrate (region 16). The substrate as illustrated in FIG. 1 is ready for a passivation layer formed in accordance with the present invention.

Figure 2:
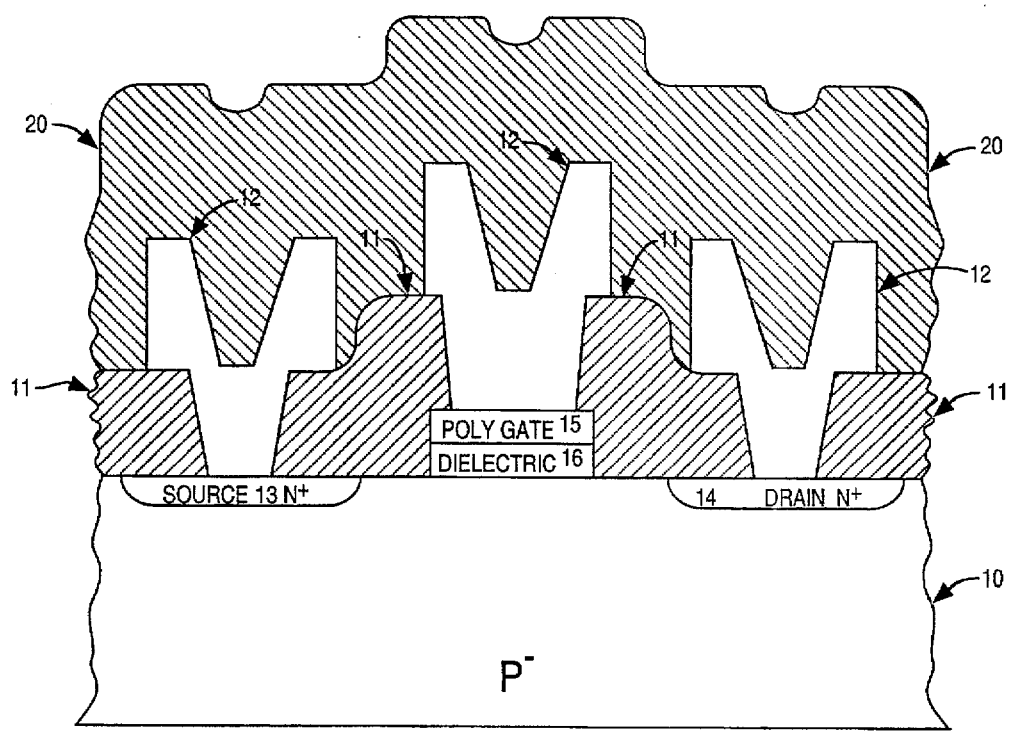
FIG. 2 is a cross sectional view of the substrate in FIG. 1 after a passivation layer doped with boron and phosphorus has been deposited onto the substrate in accordance with the method of the present invention.

FIG. 2 illustrates the passivation layer which, in accordance with the present invention, not only includes phosphorus, but the addition of a predetermined amount of boron in order to ensure that the passivation layer is substantially crack free. The boron is incorporated into the passivation layer in the manner described below.

Passivation layers are formed on a substrates using an AMS 2100 system and a WJ-999 system. The substrates are checked for cracks formed in the passivation layer following an alloy cycle (400° C. in hydrogen and nitrogen for about an hour). The AMS 2100 system is capable of producing a substantially crack free 2μm passivation layer when the phosphorus content was 4.0 weight %. (All percentages mentioned from this point on will be weight % unless stated otherwise.) On the WJ-999 system, a 2μm passivation layer with the same composition forms cracks following the alloy cycle. The prior art solutions have increased the deposition temperature or the phosphorus content, as discussed previously. Changing the deposition temperature has a drastic effects on the consumption of barrier layers and the threshold voltages of the devices. The phosphorus content of the WJ-999 system never exceeded 6.5% phosphorus. Even at these elevated concentrations, the passivation layer forms cracks. Above 6.5% phosphorus, there is serious concern about the formation of phosphoric acid within the passivation layer and photoresist adherence to the passivation layer.

Boron is a dopant used primarily to reflow CVD oxides at temperatures lower than which they would ordinarily flow if boron was not present, but this reflow temperature is generally 900° C. or higher. To the Applicant's knowledge, boron has not been used for improving crack resistance in undensified CVD oxides. Unexpectedly, the WJ-999 system was capable of forming a substantially crack-free passivation layer by adding a boron dopant to the PSG passivation layer.

The most critical parameters with this invention are the weight % boron (% B) and weight % phosphorus (% P) within the passivation layer. Tests on the WJ-999 system to determine what dopant concentrations are needed to produce a crack-free 2.0μm passivation layer. The phosphorus content is kept between 2.0% and 6.5%. Below 2.0% P, the passivation layer may not effectively getter $Na^+$ contamination; the passivation layer must stop contaminants and $Na^+$ is one of them. Above 6.5% P, phosphoric acid formation and photoresist adherence become great concerns. The invention is not limited to this range. A skilled practitioner can utilize the invention beyond the phosphorus content ranges to determine how much boron is required to form a substantially crack free passivation layer.

After the passivation layers are generated, they are checked for cracks following an alloy cycle (400° C. in hydrogen and nitrogen for about an hour). The substrates are immersed in a hot KOH and then inspected under a microscope. If cracks in the film are present, the KOH can attack the underlying metal. The data appear in FIG. 3.

Figure 3:
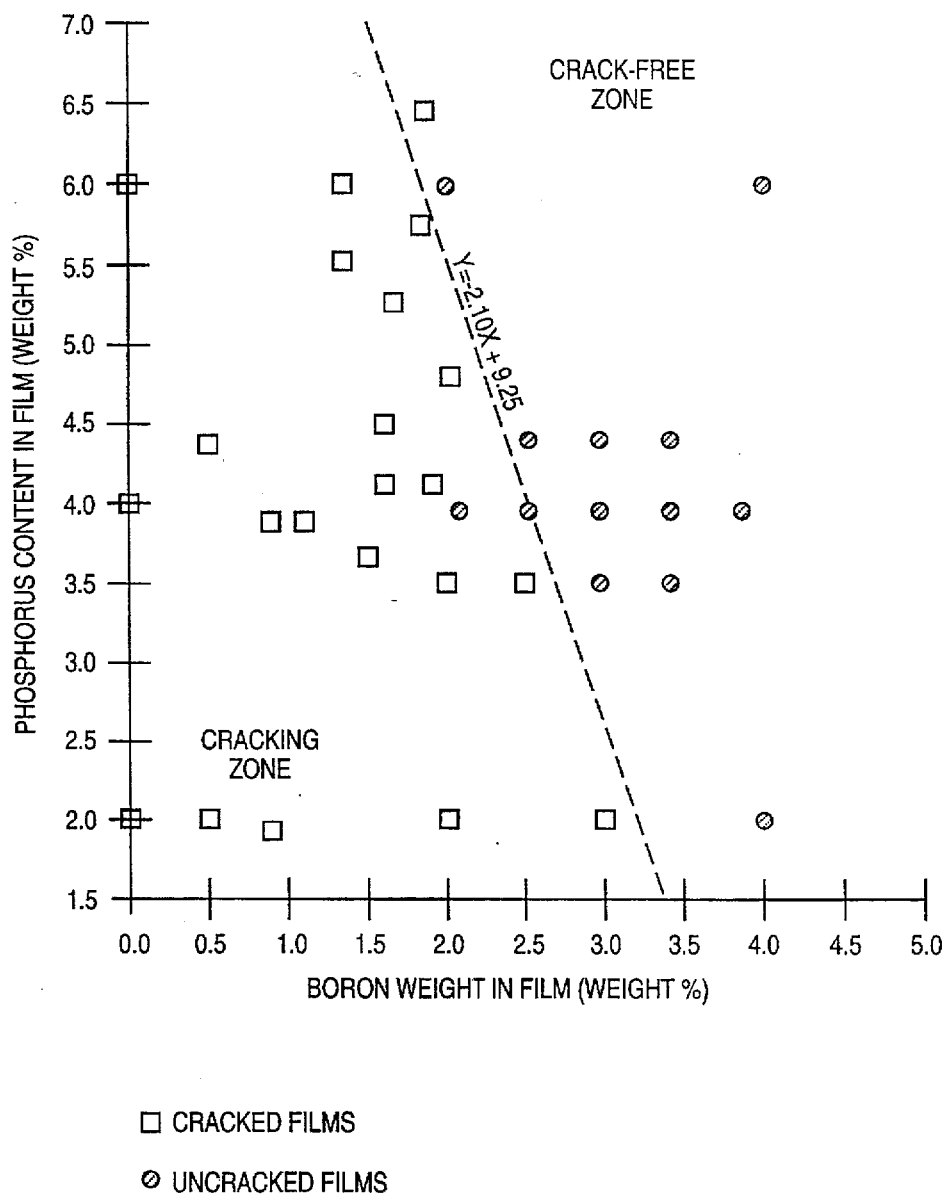
FIG. 3 is a graph illustrating the tradeoff between boron concentration and phosphorus concentration in a passivation layer while still yielding a crack-free film.

FIG. 3 shows a tradeoff between % B and % P in the passivation layer and its effect on cracks. The line on the graph marks the border where cracks in the passivation layer are formed following the alloy cycle previously described. Usually, the minimal amounts of dopants necessary for a passivation layer are chosen. Higher dopant concentrations normally increase manufacturing costs and create process side effects. In the present case, the passivation layer must provide scratch protection, be able to getter mobile ion contamination, and still produce a passivation layer which remains substantially crack-free through subsequent processing steps including alloy, assembly, and packaging steps that can reach temperatures as high as 450° C. A passivation layer with 2.75% B and 4.00% P is selected as the optimal composition based on the data in FIG. 3 and based on reliability tests (life test, temperature cycling, etc.) which indicate that boron-doped PSG passivation is as good or better than PSG passivation films according to those tests. The boron can get as low as 2.50% B (if phosphorus is held constant at 4.00% P). The extra 0.25% allows for measurement error and lot-to-lot variations. The machine parameters are adjusted to keep the composition relatively constant.

Various passivation layer and operating parameters were investigated to determine why the WJ-999 and AMS 2100 are different. As in known within the industry, the WJ-999 system is a belt-driven, cassette-to-cassette deposition system, and the AMS 2100 system is a batch feed system using trays. The WJ-999 system is self cleaning after each deposition because the deposited layer on the belt is removed by an HF solution as a point on the belt moves from the end of the deposition chamber, through the HF solution, and back to the start of the deposition chamber. The AMS 2100 system has trays that are typically cleaned after several depositions. Other differences include temperature, deposition rate, and density of the film. The WJ-999 deposition was done at 390° C. using a deposition rate between 1300 and 1400 Å/minute resulting in a film with a bulk density of 1.80 g/cc. The AMS 2100 deposition was done at 410° C. using a deposition rate between 800 and 1000Å/minute resulting in a film with a bulk density of 2.26 g/cc.

The WJ-999 system yields 7 to 8% higher (good die/wafer) than the AMS 2100 system. The higher yield is probably related to less barrier layer consumption due to the lower deposition temperature of the WJ-999 system. About half of this yield improvement is related to leaky columns. If the temperature has an impact on cracks, the WJ-999 yields should be lower than the AMS 2100 system. Cracks in the passivation film would more likely result in open circuits or short circuits. Therefore, the deposition temperature does not have a great impact on the film's cracking characteristics. A second set of WJ-999 data was generated. The deposition rate of the WJ-999 system was lowered to that of the AMS 2100 system. The WJ-999 film with the lower deposition rate still cracked when boron was not present. The actual cause of the difference in the cracking characteristics is not fully known. Still, boron must be present to keep the WJ-999 passivation layer from cracking.

The boron content needed to make a substantially crack-free passivation layer depends on the system (AMS 2100 vs. WJ-999) when using the same gas chemistry. The gas chemistry for the system comparison in this application involves forming a passivation layer from silane, oxygen, phosphine, and diborane. While the WJ-999 system produces a crack-free passivation layer when it has a composition of 2.75% B and 4.00% P, it is unable to produce a crack-free film when the composition is 0.00% B and 4.00% P. The AMS-2100 is capable of producing a crack-free film with the latter film composition. In either case, the incorporation of boron makes a film more crack resistant than if boron is not present. A further increase in boron (while phosphorus content is held constant) should increase the resistance even more. It is not known whether there is a saturation limit or a decline in its crack resistance with very high boron content (greater than 4.00% B). According to FIG. 3, the WJ-999 system requires between 1.30% B and 4.00% B. The 1.30% B is needed to keep a passivation layer with 6.50% P from cracking. The upper limit of 4.00 % B is chosen since high boron concentrations in an undensified CVD oxide is more likely to form boric acid crystals.

Because of the system dependency, FIG. 3 applies to WJ-999 systems. AMS 2100 systems have a different line that marks the border between cracked films and crackfree films. An AMS 2100 film with 0.00% B and 4.00% P does not crack. The line marking the border on an AMS 2100 system will have the line will be shifted closer to the X-Y axis or the line with a steeper slope (closer to infinity). People skilled in the art can test their systems to define where the borderline falls.

Having described the composition requirements of the passivation layer, attention is now directed to the manner of forming the passivation layer. The substrate is deposited with one or more passivation layers. The current invention uses one passivation layer, although the invention can be used for multiple passivation layers. The layer is deposited under the following conditions:

a. Reactants. Below is a listing of the various reactants that can be used for the passivation layer. The list associated with each reactant is not intended to be limiting. The list is intended to illustrate some of the options available.
  i) Silicon. Silane, disilane, DES, and TEOS are commonly used silicon sources. The preferred embodiment uses silane.
  ii) Oxygen. Molecular oxygen, ozone, and nitrous oxides are commonly used oxygen sources. The preferred embodiment uses molecular oxygen.
  iii) Phosphorus. Phosphine and trimethyl phosphite (TMPi) are common phosphorus sources. The reactants can be pure or diluted with a relatively inert gas (nitrogen, helium, or argon) or diluted with a silicon source such as silane. The preferred embodiment uses 5% phosphine diluted with 95% nitrogen.
  iv) Boron. Diborane, boron trichloride, and trimethyl borate (TMB) are common boron sources. The reactants can be pure or diluted with a relatively inert gas (nitrogen, helium, or argon) or diluted with a silicon source such as silane. The preferred embodiment uses 5% diborane diluted with 95% nitrogen.

b. Temperature. The deposition temperature is between 300° C. and 900° C. The actual deposition temperature depends on the temperature effects on underlying layers, the silicon source, and possibly the boron source used for the passivation layer.
  i) Underlying layers play an important part in selecting the maximum temperature for the passivation layer. For passivation layers, the underlying layers may include aluminum which has a melting point of 660° C. The temperature for the deposition cannot be 660° C. or higher if aluminum is one of the underlying layers. Refractory metals allow a higher deposition temperature without deforming or melting. The integrity of a barrier layer (titanium nitride, titanium silicide, etc.) can degrade with higher temperatures resulting in an increased likelihood of spike formation through the barrier layer by films immediately adjacent to the barrier layer which the barrier layer is intended to prevent. The temperature at which the barrier layer integrity degrades to an unacceptable level and thereby not preventing spike formation may provide an upper limit for the passivation formation temperature.
  ii) Temperature dependency on silicon source.
    1) Silane and disilane are used when the temperature is between 300° C. and 600° C. The optimal temperature range for silane is 370° C. to 450° C.
    2) DES is used when the temperature is between 350° C. and 700° C. The optimal temperature range for DES is 450° C. to 550° C.
    3) TEOS is used when the temperature is between 600° C. and 900° C. The optimal temperature range for TEOS is 700° C. to 800° C.
  iii) Temperature dependency on boron source. Diborane is a highly reactive gas. It decomposes at high temperatures. If the diborane reacts soon after reaching the reactor, there is no problem. The diborane may travel through an injector that runs the length of the tube before coming in contact with the other reactants. In this case, 500° C. may be an upper limit because of the possibility of decomposition of diborane in an injector.
  iv) The preferred embodiment uses a deposition temperature of 390° C.

c. Pressure. The deposition pressure for CVD oxides is usually near atmospheric pressure or lower. The selection of the actual pressure depends primarily on the deposition system used. The passivation layer used in this application is deposited near atmospheric pressure (APCVD).

d. Thickness. The thickness of the passivation layers are typically 1.0μm or thicker. The preferred embodiment uses a passivation layer with a thickness of about 2.0μm.

Following the deposition, subsequent processing steps such as alloy, pad mask and etch, assembly, and packaging are performed on the device. The subsequent steps are not critical to the invention. The developed passivation layer only needs to prevent cracks from forming during the subsequent processing steps.

Thus, a method for making a substantially crack-free passivation layer has been described.

I claim:

1. A method of forming a semiconductor device comprising the steps of:

(a) providing a circuit on a substrate, said substrate including at least one metalization layer; and (b) depositing a BPSG passivation layer over said metalization layer, said passivation layer preventing said circuit from being scratched and contaminated, said passivation layer including a predetermined amount of boron, said passivation layer being the uppermost layer of said device.

2. The method of claim 1, wherein said deposition is performed at a temperature so that said boron reacts with other compounds prior to decomposing.

3. The method of claim 1, wherein the boron content of said passivation layer does not exceed the level at which boric acid crystal formation occurs.

4. The method of claim 1, wherein said passivation layer has a phosphorus content between 2.00% and 6.50% and a boron concentration between 1.30% and 4.00%.

5. The method of claim 4, wherein the deposition system is a Watkins-Johnson 999 deposition system.

6. The method of claim 1 wherein said deposition of said BPSG passivation layer is performed in a self-cleaning, belt-driven, cassette to cassette deposition system.

7. The method of claim 6, wherein said passivation layer has a phosphorus content between 2.00% and 6.50% and a boron concentration between 1.30% and 4.00%.

8. The method of claim 1, wherein said deposition of said passivation layer is performed at a temperature lower than 660° C.

9. The method of claim 6, wherein said deposition of said passivation layer is performed at a temperature lower than 660° C.

10. The method of claim 1, wherein said substrate is not exposed to a temperature equal to or greater than 660° C. after said passivation layer is deposited.

11. The method of claim 6, wherein said substrate is not exposed to a temperature equal to or greater than 660° C. after said passivation layer is deposited.

12. The method of claim 8, wherein said substrate is not exposed to a temperature equal to or greater than 660° C. after said passivation layer is deposited.

13. The method of claim 9, wherein said substrate is not exposed to a temperature equal to or greater than 660° C. after said passivation layer is deposited.

* * * * *